United States Patent
Shih et al.

(10) Patent No.: US 8,304,785 B2
(45) Date of Patent: Nov. 6, 2012

(54) LED STRUCTURE, MANUFACTURING METHOD THEREOF AND LED MODULE

(75) Inventors: Chih-Tsung Shih, Hsinchu (TW); Chen-Peng Hsu, Jhudong Township, Hsinchu County (TW); Hung-Lieh Hu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 519 days.

(21) Appl. No.: 12/566,943

(22) Filed: Sep. 25, 2009

(65) Prior Publication Data

US 2010/0084958 A1    Apr. 8, 2010

Related U.S. Application Data

(63) Continuation-in-part of application No. 12/181,332, filed on Jul. 29, 2008, now Pat. No. 8,129,726.

(60) Provisional application No. 61/100,331, filed on Sep. 26, 2008.

(51) Int. Cl.
    *H01L 27/15* (2006.01)

(52) U.S. Cl. ............ 257/79; 257/103; 257/E33; 257/98; 257/99; 438/26

(58) Field of Classification Search .................... 257/79, 257/103, E33, 98, 99; 438/26
    See application file for complete search history.

(56) References Cited

U.S. PATENT DOCUMENTS

| | | | |
|---|---|---|---|
| 4,174,512 A | 11/1979 | Blatter | |
| 6,300,554 B1 | 10/2001 | Du et al. | |
| 6,333,522 B1 | 12/2001 | Inoue et al. | |
| 6,642,072 B2 | 11/2003 | Inoue et al. | |
| 6,642,550 B1 | 11/2003 | Whitworth et al. | |
| 6,655,834 B1 | 12/2003 | Frey et al. | |
| 6,985,000 B2 * | 1/2006 | Feder et al. | 324/750.05 |
| 7,148,514 B2 | 12/2006 | Seo et al. | |
| 7,151,281 B2 | 12/2006 | Shei et al. | |
| 2004/0120156 A1 | 6/2004 | Ryan | |
| 2004/0147057 A1 | 7/2004 | Benzel et al. | |
| 2005/0072926 A1 | 4/2005 | Nassiopoulou et al. | |
| 2005/0156186 A1 | 7/2005 | Lin et al. | |
| 2005/0230692 A1 | 10/2005 | Kim et al. | |
| 2005/0238080 A1 | 10/2005 | Wolkin et al. | |
| 2005/0275065 A1 | 12/2005 | Cogan et al. | |
| 2005/0279949 A1 | 12/2005 | Oldham et al. | |
| 2006/0006430 A1 | 1/2006 | Kim et al. | |
| 2006/0081781 A1 | 4/2006 | Bluzer | |
| 2006/0138436 A1 * | 6/2006 | Chen et al. | 257/98 |
| 2006/0163604 A1 | 7/2006 | Shin et al. | |
| 2008/0044939 A1 | 2/2008 | Nassiopoulou et al. | |
| 2008/0099785 A1 * | 5/2008 | Bai et al. | 257/190 |

* cited by examiner

*Primary Examiner* — Kenneth Parker
*Assistant Examiner* — Dale E Page
(74) *Attorney, Agent, or Firm* — McClure, Qualey & Rodack LLP

(57) ABSTRACT

A light emitting diode (LED) structure, a manufacturing method thereof and a LED module are provided. The LED structure has temperature sensing function. The LED structure comprises a composite substrate and an LED. The composite substrate comprises a diode structure whose P-type semiconductor region or N-type semiconductor region has a predetermined doping concentration. The diode structure is a temperature sensor, and the sensitivity of the temperature sensor is based on the predetermined doping concentration. The LED is disposed on the composite substrate. The diode structure is used for sensing the heat emitted from the LED.

7 Claims, 5 Drawing Sheets

LED STRUCTURE, MANUFACTURING METHOD THEREOF AND LED MODULE

This is a continuation-in-part application of application Ser. No. 12/181,332, filed Jul. 29, 2008, and claims the benefit of U.S. provisional application Ser. No. 61/100,331 filed Sep. 26, 2008, the subject matters of which are incorporated herein by reference.

BACKGROUND

1. Technical Field

The disclosure relates in general to a light emitting diode (LED) structure, a manufacturing method thereof and an LED module, and more particularly to an LED structure capable of sensing the temperature, a manufacturing method thereof and an LED module.

2. Description of the Related Art

Light emitting diode (LED) has a wide range of application such as street light, vehicle lamp, and planar display. As the power requirement of the LED becomes larger and larger, the product design also becomes more and more complicated. Thus, the industry is now focused on the integration of technology and product.

Let the temperature sensing technology be taken for example. The measurement of the environmental temperature around the metal is based on the change of resistance under different temperatures.

However, the above method consumes more power and generates more heat, resulting in product power loss and boosting the temperature.

SUMMARY

The disclosure is directed to a light emitting diode (LED) structure, a manufacturing method thereof and an LED module. The diode structure is used as a temperature sensor, so that the power loss and the generated heat are reduced.

According to a first aspect of the disclosure, an LED structure capable of sensing temperature is provided. The LED structure comprises a composite substrate and an LED. The composite substrate comprises a diode structure whose P-type semiconductor region or N-type semiconductor region has a predetermined doping concentration. The diode structure is a temperature sensor, and the sensitivity of the temperature sensor is based on the predetermined doping concentration. The LED is disposed on the composite substrate. The diode structure is used for sensing the heat emitted from the LED.

According to a second aspect of the disclosure, a manufacturing method of an LED structure is provided. The manufacturing method comprises the following steps. A composite substrate comprising a diode structure is provided. A P-type semiconductor region or an N-type semiconductor region of the diode structure has a predetermined doping concentration. The diode structure is a temperature sensor, and the sensitivity of the temperature sensor is based on the predetermined doping concentration. An LED is disposed on composite substrate. The diode structure is used for sensing the heat emitted from the LED.

According to a third aspect of the disclosure, an LED module having temperature measuring function is provided. The LED module comprises an LED structure and a temperature measuring module. The temperature measuring module is electrically connected to the LED structure. The LED structure comprises a composite substrate and an LED. The composite substrate comprises a diode structure whose P-type semiconductor region or N-type semiconductor region has a predetermined doping concentration. The diode structure is a temperature sensor, and the sensitivity of the temperature sensor is based on the predetermined doping concentration. The LED is disposed on the composite substrate. The temperature measuring module comprises a voltage source, a resistor and a temperature calculating unit. The voltage source is connected to one of the P-type semiconductor region and the N-type semiconductor region. The resistor is connected to the voltage source and the other of the P-type semiconductor region and the N-type semiconductor region. The temperature calculating unit is electrically connected to the resistor for calculating the temperature of the heat according to the voltage difference between two terminals of the resistor. The diode structure is used for sensing the heat emitted from the LED.

According to a fourth aspect of the disclosure, an LED structure capable of sensing temperature and providing electrostatic discharge (ESD) protection function. The LED structure comprises a composite substrate and an LED. The composite substrate comprises a first diode structure and a second diode structure. A P-type semiconductor region or an N-type semiconductor region of the first diode structure has a predetermined doping concentration. The diode structure is a temperature sensor, and the sensitivity of the temperature sensor is based on the predetermined doping concentration. The LED is disposed on the composite substrate, and is electrically connected to the second diode structure. The first diode structure is used for sensing the heat emitted from the LED, and the second diode structure provides electrostatic discharge protection for the LED.

According to a fifth aspect of the disclosure, a manufacturing method of an LED structure is provided. The manufacturing method comprises the following steps. A composite substrate comprising a first diode structure and a second diode structure is provided. A P-type semiconductor region or an N-type semiconductor region of the first diode structure has a predetermined doping concentration. The diode structure is a temperature sensor, and the sensitivity of the temperature sensor is based on the predetermined doping concentration. An LED is disposed on composite substrate, and is electrically connected to the second diode structure. The first diode structure is used for sensing the heat emitted from the LED, and the second diode structure provides electrostatic discharge protection for the LED.

According to a sixth aspect of the disclosure, an LED module capable of sensing temperature and providing electrostatic discharge protection function is provided. The LED module comprises an LED structure and a temperature measuring module. The temperature measuring module is electrically connected to the LED structure. The LED structure comprises a composite substrate and an LED. The composite substrate comprises a diode structure whose P-type semiconductor region or N-type semiconductor region has a predetermined doping concentration. The diode structure is a temperature sensor, and the sensitivity of the temperature sensor is based on the predetermined doping concentration. The LED is disposed on the composite substrate. The temperature measuring module comprises a voltage source, a resistor and a temperature calculating unit. The voltage source is connected to one of the P-type semiconductor region and the N-type semiconductor region. The resistor is connected to the voltage source and the other of the P-type semiconductor region and the N-type semiconductor region. The temperature calculating unit is electrically connected to the resistor for calculating the temperature of the heat according to the voltage difference between two terminals of the resistor. The diode structure is used for sensing the heat emitted from the LED.

The disclosure will become apparent from the following detailed description of the non-limiting embodiments. The following description is made with reference to the accompanying drawings.

DETAILED DESCRIPTION

The disclosure is exemplified by a number of embodiments below. However, the disclosure of the embodiments below are merely for exemplification, and the accompanying drawing are for elaboration only, not for limiting the scope of protection of the disclosure. Also, secondary elements are omitted in the embodiments for highlighting the technical features of the disclosure.

First Embodiment

Figure 1:
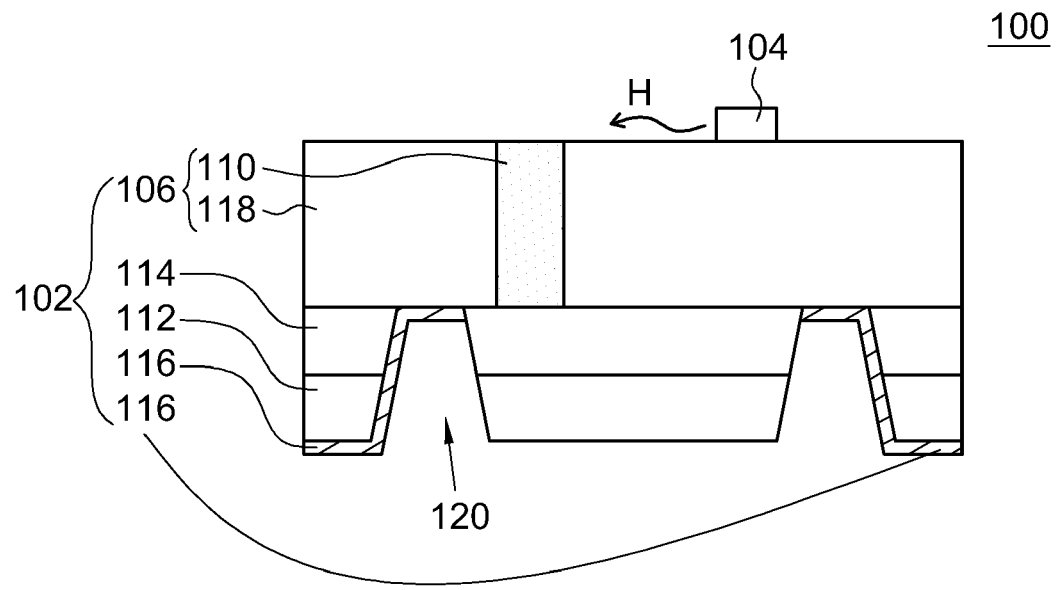
FIG. 1 shows an LED structure according to a first embodiment of the disclosure.

Referring to FIG. 1, an LED structure according to a first embodiment of the disclosure is shown. The LED structure 100 comprises a composite substrate 102 and an LED 104.

The LED 104 is disposed on a first silicon substrate 118 of the composite substrate 102 and is adjacent to a diode structure 106.

The diode structure 106 senses the heat H emitted from the LED 104. The diode structure 106 is an embedded structure in the first silicon substrate 118, wherein, the diode structure 106 is a Zener diode, a Schottky diode or other diode formed by group III-V.

The composite substrate 102, such as a silicon-on-insulator (SOI) substrate, comprises a first silicon substrate 118, a second silicon substrate 112, and an insulation layer 114, and has several grooves 120. The insulation layer 114 is disposed between the first silicon substrate 118 and the second silicon substrate 112. The heat transfer coefficient of the insulation layer 114 is smaller than that of the first silicon substrate 118 and the second silicon substrate 112, so that most of the heat H is absorbed by the diode structure 106. The insulation layer 114 is a silicon dioxide for example.

The composite substrate 102 further comprises an electrode 116 disposed on the inner-wall of the groove 120 in the composite substrate 102 and electrically connected to a circuit board (not illustrated).

A P-type semiconductor region, such as the first silicon substrate 118, or an N-type semiconductor region of the diode structure 106, such as the semiconductor region 110. In the embodiment of the disclosure, semiconductor region 110 is the heavily doped region which having predetermined doping concentration ranging between $10^{17}$ and $10^{19}$ cm$^{-3}$. The diode structure 106 can be used as a temperature sensor, and the sensitivity of the temperature sensor is based on the predetermined doping concentration.

In this embodiment, though the composite substrate 102 is exemplified by P-type composite substrate which is heavily doped to form N-type semiconductor region. However, in other implementations, the composite substrate 102 can be N-type composite substrate which is heavily doped to form P-type semiconductor region.

Figure 2:
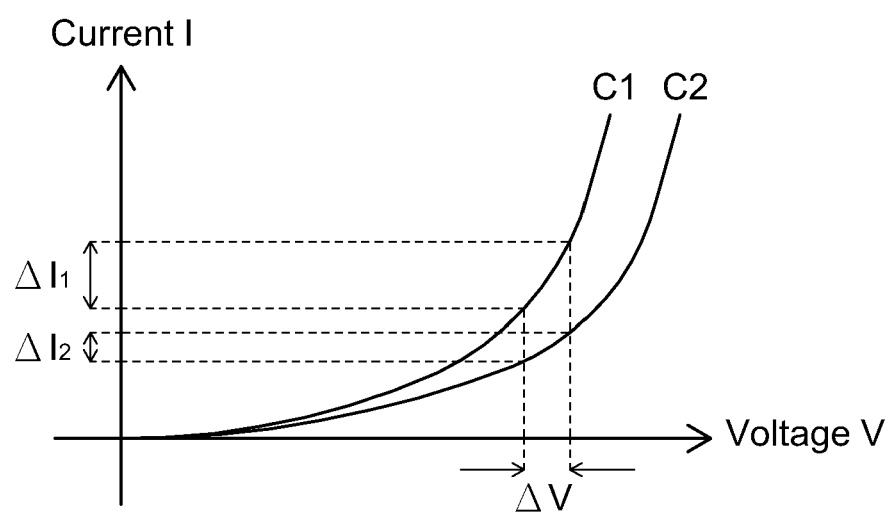
FIG. 2 shows a voltage-current relationship chart of the diode structure of FIG. 1 in different doping concentrations.

Referring to FIG. 2, a voltage-current relationship chart of the diode structure of FIG. 1 in different doping concentrations is shown. The doping concentration C1 and the doping concentration C2 are exemplified by the doping concentration of the P-type semiconductor region of the diode structure 106, wherein the doping concentration C1 is larger than the doping concentration C2. According to the slope of the curve of FIG. 2, when driven by the same voltage difference $\Delta V$, the current range $\Delta I_1$ outputted by the diode structure with the doping concentration C1 is larger than the current range $\Delta I_2$ outputted by the diode structure with the doping concentration C2. That is, the diode structure with the doping concentration C1 is more sensitive to temperature than the diode structure with the doping concentration C2.

Thus, by the way of adjusting the doping concentration, a diode structure having specific sensitive to temperatures is obtained.

Figure 3:
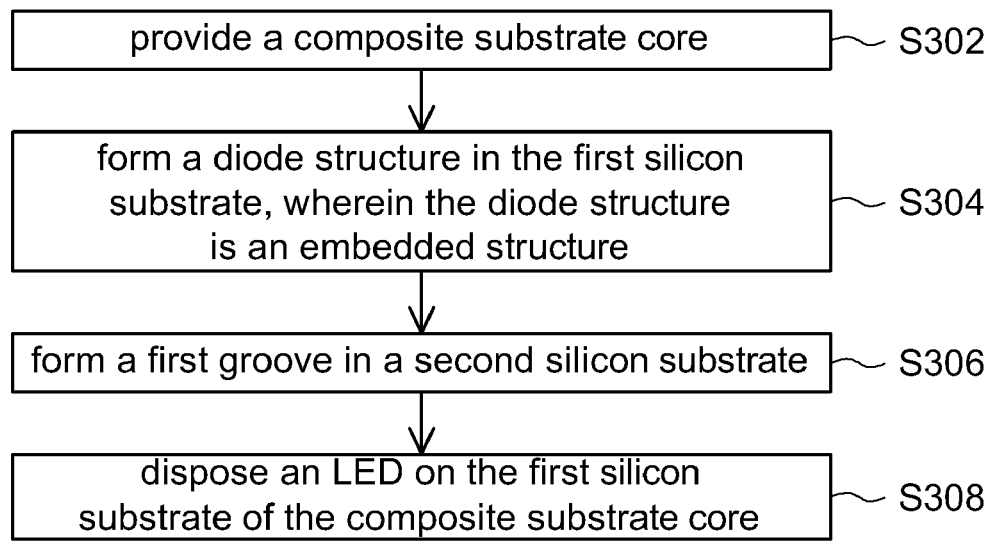
FIG. 3 shows a method flowchart of manufacturing an LED structure according to a first embodiment of the disclosure.
Figure 4A:
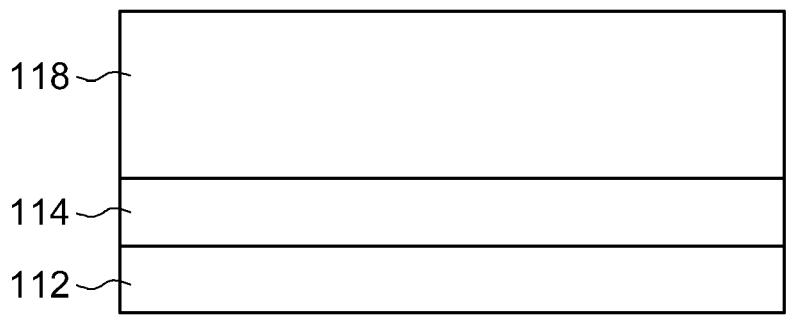
FIGS. 4A to 4C show the process of manufacturing an LED structure according to a first embodiment of the disclosure.
Figure 4B:
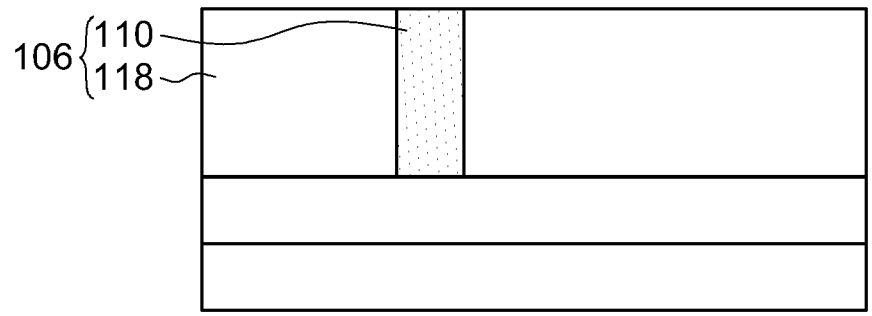
Figure 4C:
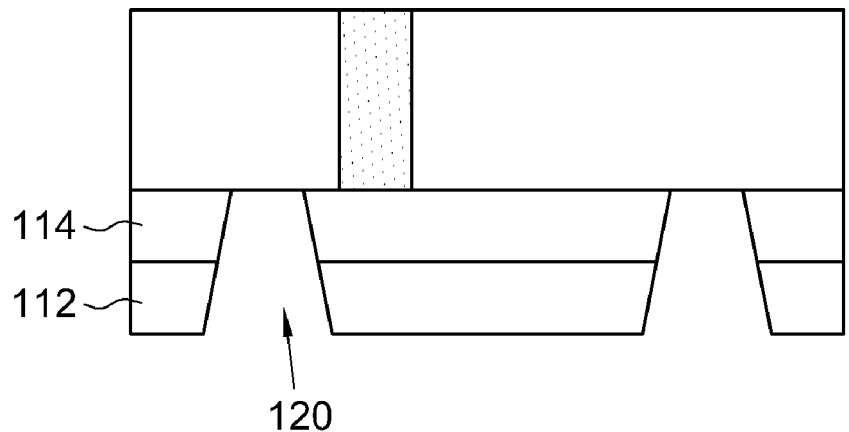

Referring to FIG. 3 and FIGS. 4A to 4C. FIG. 3 shows a method flowchart of manufacturing an LED structure according to a first embodiment of the disclosure. FIGS. 4A to 4C show the process of manufacturing an LED structure according to a first embodiment of the disclosure.

In step S302, as indicated in FIG. 4A, a composite substrate core 122 is provided. The composite substrate core 122 comprises a first silicon substrate 118, an insulation layer 114 and a second silicon substrate 112 arranged in sequence.

Next, in step S304, as indicated in FIG. 4B, a diode structure 106 is formed in the first silicon substrate 118, wherein the diode structure 106 is an embedded structure. The P-type semiconductor region of the diode structure 106 is a first silicon substrate 118, and the N-type semiconductor region of the diode structure 106 is a semiconductor region 110.

Then, in step S306, as indicated in FIG. 4C, a groove 120 is formed in the second silicon substrate 112, wherein the groove 120 passes through the second silicon substrate 112 and the insulation layer 114.

After step S306, the inner-wall of the groove 120 of the electrode 116 (electrode 116 is illustrated in FIG. 1) can be formed to form a composite substrate 102.

The composite substrate of the embodiment of the disclosure can have different structures, and is not limited to the structure exemplified in the composite substrate 102 of FIG. 4A.

Then, in step S308, the LED 104 is disposed on the first silicon substrate 118 of the composite substrate 102 to form the LED structure 100 as indicated in FIG. 1.

In an embodiment, after step S308, a sealant (not illustrated) can be used to encapsulate the LED 104 and cover the upper surface of the first silicon substrate 118 to protect the LED 104 and the composite substrate 102.

Besides, in other embodiments, the LED structure 100 can be disposed on and electrically connected to a semiconductor thermoelectric cooling (TEC) chip (not illustrated) so that the LED structure has the function of heat dissipating.

As the temperature of the LED structure 100 having a semiconductor TEC chip become higher, the current generated by the LED structure 100 also becomes larger. The semiconductor TEC chip determines how much heat should be dissipated from the LED structure 100 according to the value of the current.

Second Embodiment

Figure 5:
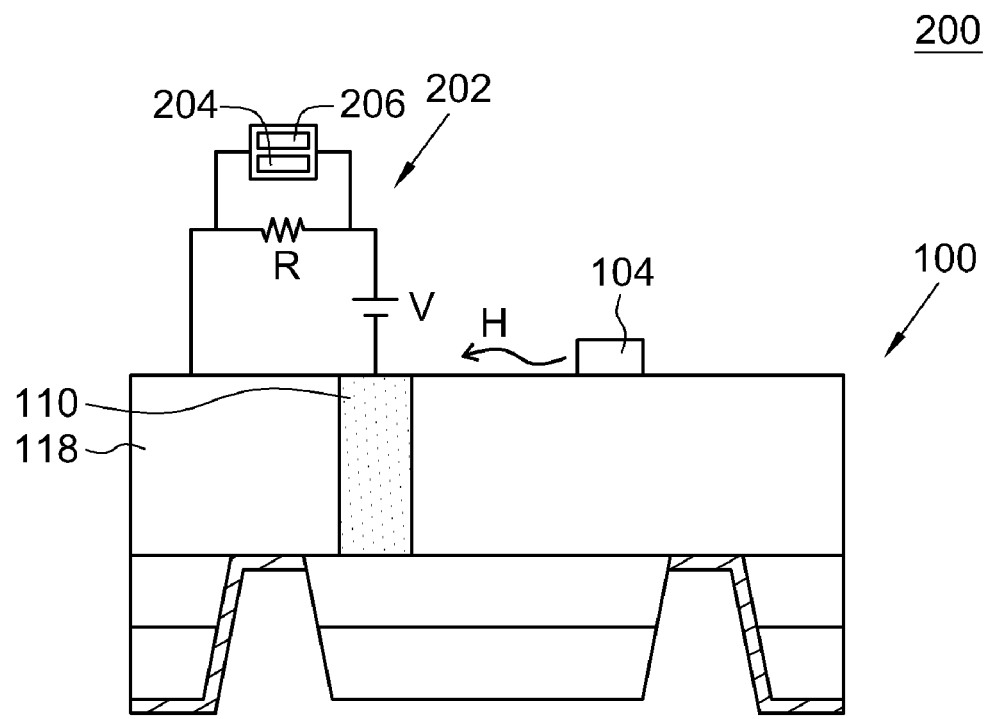
FIG. 5 shows an LED module according to a second embodiment of the disclosure.

Referring to FIG. 5, an LED module according to a second embodiment of the disclosure is shown. In the elements of the second embodiment identical to that of the first embodiment, the same designations are used, and are not repeated here. The LED module 200 of the second embodiment comprises an LED structure 100 and a temperature measuring module 202. The temperature measuring module 202 is electrically connected to the LED structure 100.

The temperature measuring module 202 comprises a voltage source V, a resistor R, a temperature calculating unit 204 and a display unit 206.

The voltage source V is connected to semiconductor region 110, the resistor R is connected to the P-type semiconductor region of the diode structure 106 and a voltage source V.

The temperature calculating unit 204 is electrically connected to the resistor R for calculating the temperature of the heat H according to the voltage difference between two terminals of the resistor R.

Figure 6:
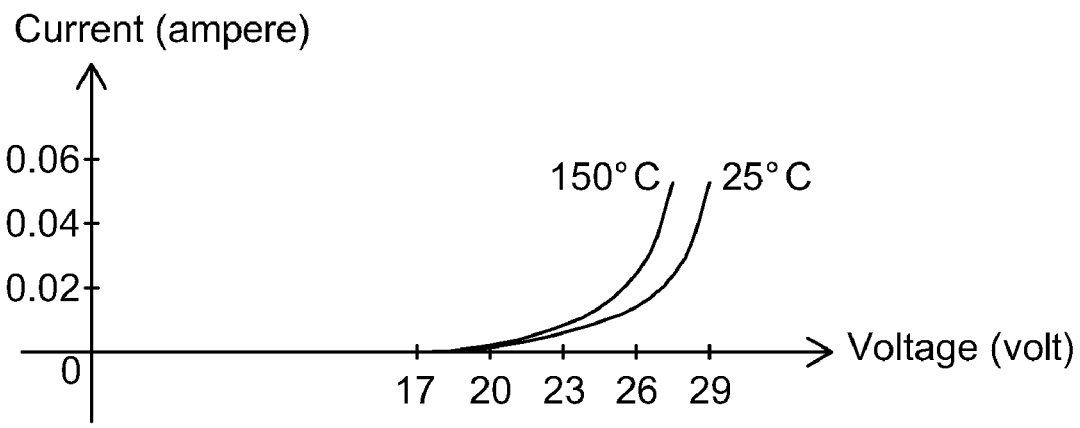
FIG. 6 shows a voltage-current relationship chart of the diode structure of FIG. 5 in different temperatures.

Referring to FIG. 6, a voltage-current relationship chart of the diode structure of FIG. 5 in different temperatures is shown. Under the same doping concentration and voltage, the current generated by the diode structure under the environmental temperature of 150° C. is larger than the current generated by the diode structure under the environmental temperature of 25° C. The temperature of the heat H can be calculated according to the above characteristics.

Besides, the doping concentration of the diode structure is adjusted according to the sensitivity requirement of an external circuit such as a temperature measuring module 202. For example, if the current flowing through the resistor R needs to be larger for the temperature measuring module 202 to detect the voltage difference between two terminals of the resistor R, the doping concentration of the diode structure needs to be increased to increase the output of the current.

The display unit 206 is electrically connected to the temperature calculating unit 204 for displaying the reading of the temperature.

Thus, the user can obtain knowledge of the temperature of the LED structure 100 of FIG. 5 by the display unit 206.

Third Embodiment

Figure 7:
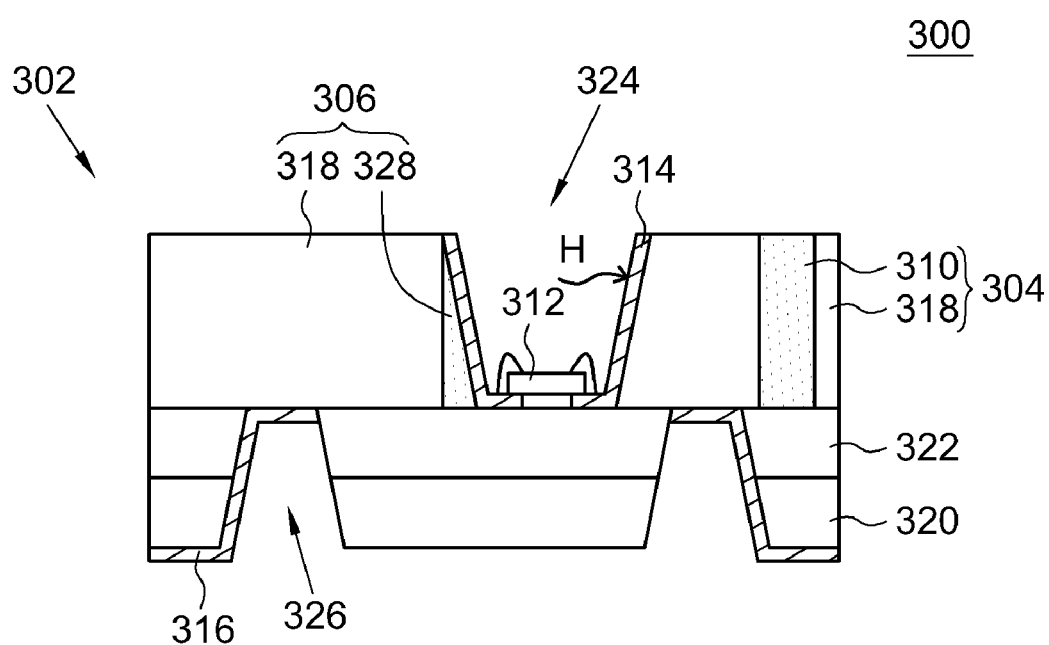
FIG. 7 shows an LED structure according to a third embodiment of the disclosure.

Referring to FIG. 7, an LED structure according to a third embodiment of the disclosure is shown. For the elements of the third embodiment identical to that of the first embodiment, the same designations are used, and are not repeated here. The LED structure 300 of the third embodiment differs with the LED structure 100 of the first embodiment in that the LED structure 300 comprises two diode structures.

Furthermore, the LED structure 300 comprises a composite substrate 302 and an LED 312. The composite substrate 302 comprises two diode structures (that is, a first diode structure 304 and a second diode structure 306), a first silicon substrate 318, a second silicon substrate 320, an insulation layer 322, a first electrode 314, several second electrodes 316, several second grooves 326 and a first groove 324. In the embodiment of the disclosure, semiconductor region 328 and 310 are the heavily doped region which having predetermined doping concentration ranging between $10^{17}$ and $10^{19}$ cm$^{-3}$.

In this embodiment, though the composite substrate 302 is exemplified by P-type composite substrate which is heavily doped to form N-type semiconductor region. However, in other implementations, the composite substrate 302 can be N-type composite substrate which is heavily doped to form P-type semiconductor region.

The first groove 324 is connected to the second diode structure 306 and passes through the first silicon substrate 118, and the second groove 326 passes through the second silicon substrate 320 and the insulation layer 322.

The LED 312 is disposed in the first groove 324 and electrically connected to the second diode structure 306 through the first electrode 314.

The second diode structure 306 comprises a P-type semiconductor region, such as the first silicon substrate 318 and an N-type semiconductor region 328. The second diode structure 306 provides electrostatic discharge protection for the LED 312.

The first diode structure 304 is used for sensing the heat H emitted from the LED 312. A P-type semiconductor region (such as the first silicon substrate 318) or an N-type semiconductor region (such as the semiconductor region 310) of the first diode structure 304 has a predetermined doping concentration. The predetermined doping concentration is similar to the doping concentrations C1 and C2 disclosed in the first embodiment and is not repeated here.

The second electrode 316 is disposed on the inner-wall of the second groove 326 and is electrically connected to a circuit board (not illustrated).

Figure 8:
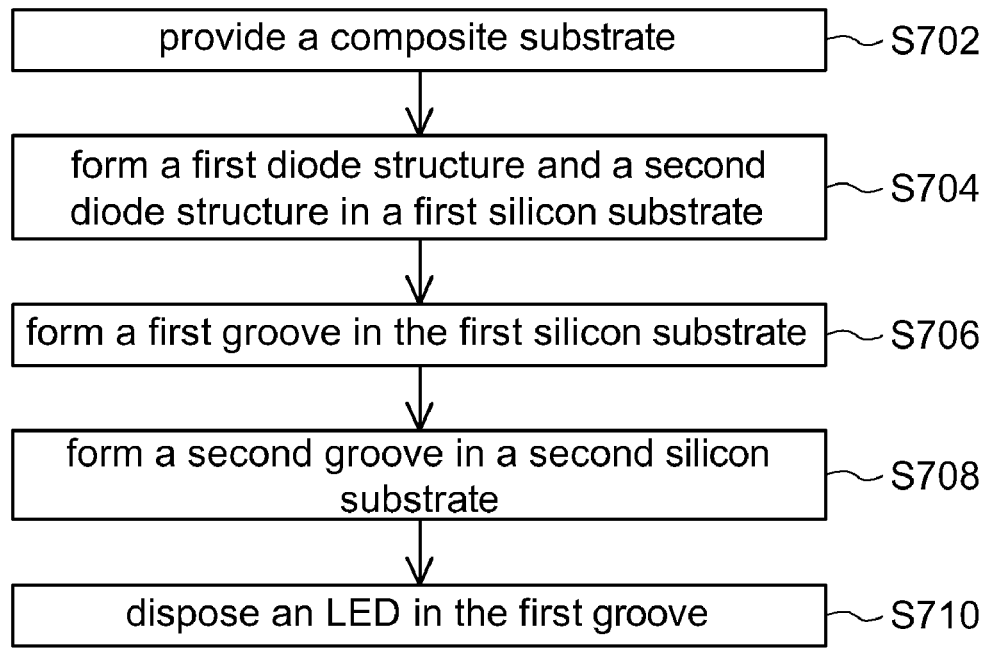
FIG. 8 shows a method flowchart of manufacturing an LED structure according to a third embodiment of the disclosure.

Referring to FIG. 8, a method flowchart of manufacturing an LED structure according to a third embodiment of the disclosure is shown.

In step S702, a composite substrate (not illustrated) is provided. The composite substrate comprises a first silicon substrate 318, an insulation layer 322 and a second silicon substrate 320 arranged in sequence.

Next, in step S704, a first diode structure 304 and a second diode structure 306 are formed in the first silicon substrate 318, wherein the first diode structure 304 and the second diode structure 306 are an embedded structure.

In step S704, the first diode structure 304 and the second diode structure 306 are formed in the same process, so that manufacturing cost and labor hours are reduced.

Then, the method proceeds to step S706, a first groove 324 is formed in the first silicon substrate 318, wherein the first groove 324 is connected to the second diode structure 306 and passes through the first silicon substrate 318.

After that, the method proceeds to step S708, a second groove 326 is formed in the second silicon substrate 320, wherein the second groove 326 passes through the second silicon substrate 320 and the insulation layer 322.

Afterwards, the method proceeds to step S710, an LED 312 is disposed in the first groove 324. In an embodiment, the first diode structure 304 is adjacent to the LED 312. Thus, the LED structure 300 of FIG. 7 is formed.

In an embodiment, after step S710, a sealant (not illustrated) can be used to encapsulate the LED 312 and the upper surface of the composite substrate 302 to protect the LED 312 and the composite substrate 302.

In other implementations, the LED structure 300 can be disposed on and electrically connected to a semiconductor TEC chip (not illustrated) for dissipating and cooling the LED structure 300.

Fourth Embodiment

Figure 9:
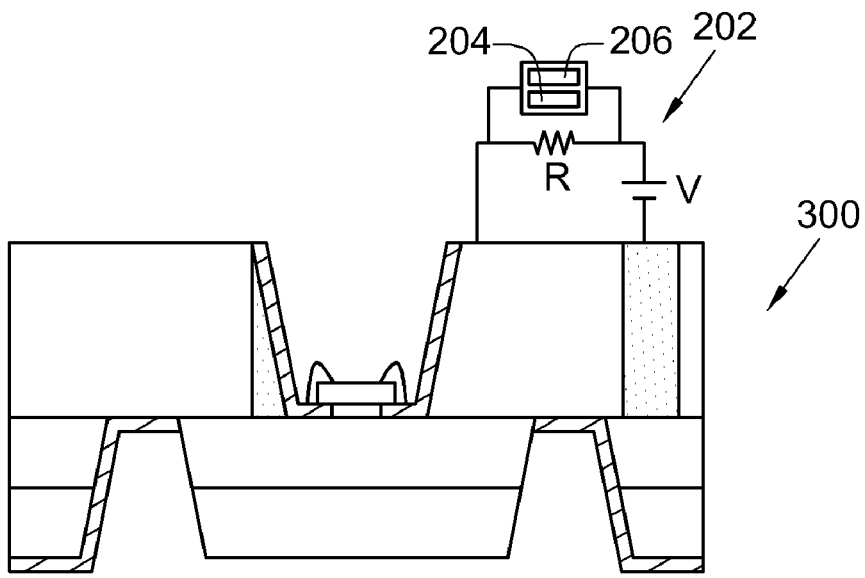
FIG. 9 shows an LED module according to a fourth embodiment of the disclosure.

Referring to FIG. 9, an LED module according to a fourth embodiment of the disclosure is shown. For the elements of the fourth embodiment identical to that of the third embodiment and the second embodiment, the same designations are used and are not repeated here. The LED module 400 of the fourth embodiment comprises an LED structure 300 and a temperature measuring module 202. The temperature measuring module 202 is electrically connected to the LED structure 300.

The electrical connection between the temperature measuring module 202 and the LED structure 300 is similar to that between the temperature measuring module 202 and the LED structure 100, and is not repeated here.

In the embodiment of the disclosure, the user can obtain the knowledge of the temperature of the LED structure 300 of FIG. 9 through the display unit 206.

The LED structure, the manufacturing method thereof and the LED module disclosed in the above embodiments of the disclosure have many characteristics exemplified below:

(1). The first diode structure and the second diode structure can be formed in the same process so as to reduce manufacturing cost and labor hours.

(2). The diode structure is used as a temperature sensor so as to reduce the power loss of the product and the generated heat.

(3). The diode structures of the above embodiments such as Zener, Schottky diodes or diodes formed by group III-V can be used as a temperature sensor and also provides electrostatic discharge protection.

(4). By adjusting the doping concentration, the diode structure sensitive for different temperatures is obtained. That is, the doping concentration of the diode structure can be adjusted according to the sensitivity requirement of an external circuit such as a temperature measuring module or a semiconductor TEC chip to comply with the characteristics of the external circuit.

While the disclosure has been described by way of example and in terms of the embodiments, it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A light emitting diode (LED) structure comprises:
a composite substrate comprising a first silicon substrate, a second silicon substrate, an insulation layer and a semiconductor region, wherein the first silicon substrate covers an upper surface of the insulation layer, the insulation layer is disposed between the first silicon substrate and the second silicon substrate, the semiconductor region is embedded within the first silicon substrate, the first silicon substrate and the semiconductor region together form a diode structure, wherein the first silicon substrate is one of a P-type semiconductor region and an N-type semiconductor region of the diode structure, the semiconductor region is another of the P-type semiconductor region and the N-type semiconductor region of the diode structure, and the P-type semiconductor region or the N-type semiconductor region has a predetermined doping concentration, the diode structure is a temperature sensor, and the sensitivity of the temperature sensor is based on the predetermined doping concentration; and
an LED disposed on the composite substrate;
wherein, the diode structure is used for sensing a heat emitted from the LED.

2. The LED structure according to claim 1, wherein the predetermined doping concentration ranges between $10^{17}$ and $10^{19}$ cm$^{-3}$.

3. The LED structure according to claim 1, wherein the LED is adjacent to the diode structure.

4. The LED structure according to claim 1, wherein the heat transfer coefficient of the insulation layer is smaller than that of the first silicon substrate and the second silicon substrate.

5. The LED structure according to claim 1, further comprising:
a semiconductor thermoelectric cooling (TEC) chip, wherein the composite substrate is disposed on and connected to the semiconductor TEC chip.

6. The LED structure according to claim 1, wherein the composite substrate has a groove, which passes through the second silicon substrate and the insulation layer;
wherein, the LED is disposed on the groove.

7. The LED structure according to claim 1, wherein the diode structure comprises a Zener diode, a Schottky diode or a diode formed by elements of group III-V.

* * * * *